United States Patent
Lyu

[11] Patent Number: 5,874,326
[45] Date of Patent: Feb. 23, 1999

[54] METHOD FOR FABRICATING THIN FILM TRANSISTOR

[75] Inventor: Ki Hyun Lyu, Ansan, Rep. of Korea

[73] Assignee: LG Electronics Inc., Seoul, Rep. of Korea

[21] Appl. No.: 899,207

[22] Filed: Jul. 23, 1997

[30] Foreign Application Priority Data

Jul. 27, 1996 [KR] Rep. of Korea ................ 1996-30828

[51] Int. Cl.[6] .................... H01L 21/336; H01L 21/84
[52] U.S. Cl. .............................. 438/158; 438/159
[58] Field of Search .................... 438/158, 159, 438/30, 482, 484, 155, 183, 200, 261, 749, 750, 751

[56] References Cited

U.S. PATENT DOCUMENTS

| | | |
|---|---|---|
| 5,427,962 | 6/1995 | Sasaki et al. . |
| 5,470,769 | 11/1995 | Kim . |
| 5,473,168 | 12/1995 | Kawai et al. ................... 257/61 |
| 5,478,766 | 12/1995 | Park et al. . |
| 5,567,633 | 10/1996 | Gosain et al. . |
| 5,621,556 | 4/1997 | Fulks et al. ..................... 438/701 |

FOREIGN PATENT DOCUMENTS

| | | |
|---|---|---|
| 60-17479 | 4/1985 | Japan . |
| 4-163528 | 6/1992 | Japan . |

*Primary Examiner*—Mary Wilczewski
*Attorney, Agent, or Firm*—Finnegan, Henderson, Farabow, Garrett & Dunner, L.L.P.

[57] ABSTRACT

The thin film transistor is fabricated by etching a semiconductor layer, $n^+$ semiconductor layer, etch stopper layer, and metal layer with single etching process to decrease the number of masks. By controlling the thickness of the semiconductor layer or the etching selection ratio of the etch stopper layer, an etch stopper thin film transistor or back channel etched thin film transistor can be fabricated.

17 Claims, 6 Drawing Sheets

METHOD FOR FABRICATING THIN FILM TRANSISTOR

BACKGROUND OF THE INVENTION

The present invention relates to liquid crystal display devices, and more particularly to a simplified method for fabricating liquid crystal displays in which an organic or inorganic insulating layer can be applied as a passivation layer according to the thickness of a semiconductor layer or etching selection ratio of the etch stopper layer.

An important display device, the cathode ray tube(CRT) display device has a large screen area. However, since the screen on which the luminescence material is coated must be separated from the electron gun a distance greater than that prescribed for the large screen area, a CRT display device has a large volume. Therefore, CRT devices cannot be used in a low power consumption portable television, small notebook computers or the like.

Among the various flat panel display devices characterized by low power consumption and small size, such as LCD(liquid crystal display), PDP(plasma display panel), VFD(vacuum florescent display), and ELD(electromagnetic display), the LCD has emerged because of its capability for high resolution.

Figure 1:
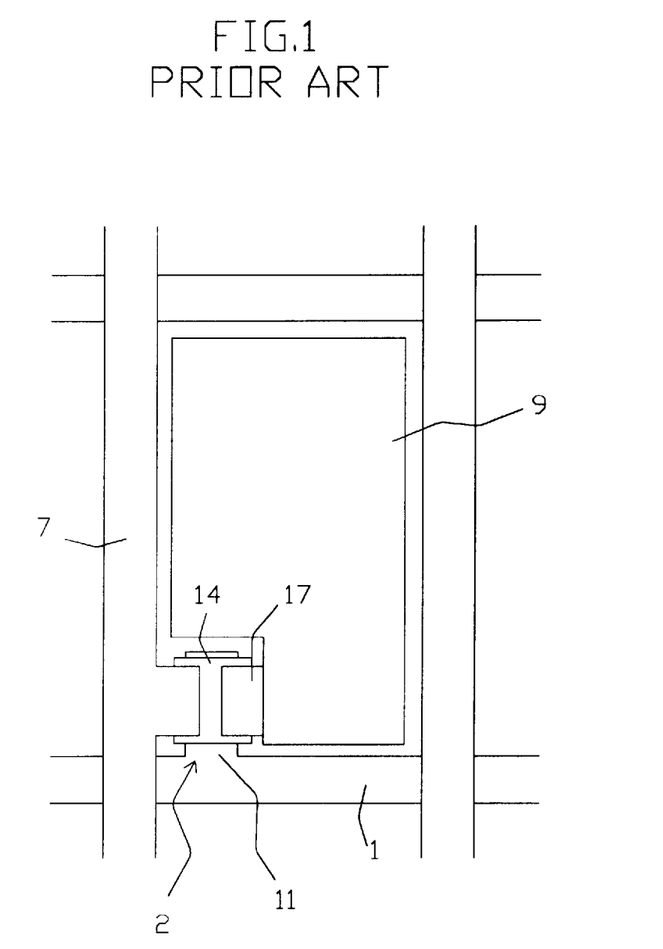
FIG. 1 is a partial plan view showing one pixel of a liquid crystal display device.

FIG. 1 is a partial plan view of an AMLCD. This LCD is a TFT(thin film transistor) LCD. In this figure, a plurality of pixels are formed in a matrix shape by a plurality of gate bus lines 1 and data bus lines 7 which extend in the horizontal and vertical directions. For explanatory purposes, only one pixel is described. In the pixel, pixel electrode 9 is formed and TFT 2 is formed at the intersection of gate bus line 1 and data bus line 7. A gate electrode 11 and source/drain electrode 17 of TFT 2 are connected to gate bus line 1 and data bus line 7, respectively. When a voltage is applied to gate bus line 1 from the gate driver circuit(not shown) TFT 2 is turned on, and at the same time, the signal is applied to the pixel electrode 9 from a data driver circuit(not shown) through TFT 2.

There are two types of inverted stagger structure TFTs. One is ES TFT(etch stopper TFT) and the other is BCE TFT(back channel etched TFT). In the ES TFT, the ES layer is formed over the semiconductor layer to prevent the channel region of the semiconductor layer from being etched when the semiconductor layer and the source/drain electrodes are etched. In the BCE TFT, since there is no insulating layer on the semiconductor layer, the process is simpler, although the semiconductor layer in the channel region is etched during the process.

Figure 2A:
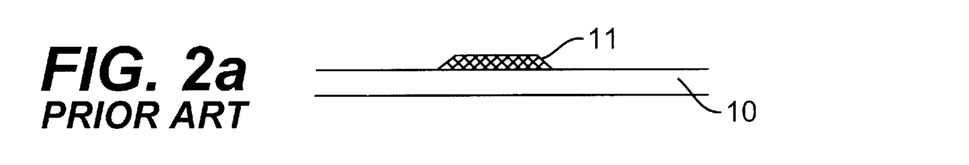
FIGS. 2a–2f are views illustrating the conventional method of fabricating a thin film transistor of a liquid crystal display device.
Figure 2B:
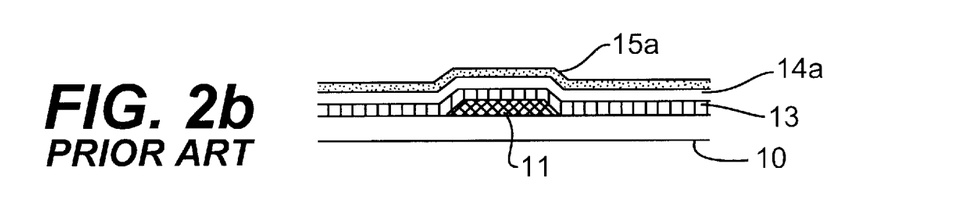
Figure 2C:
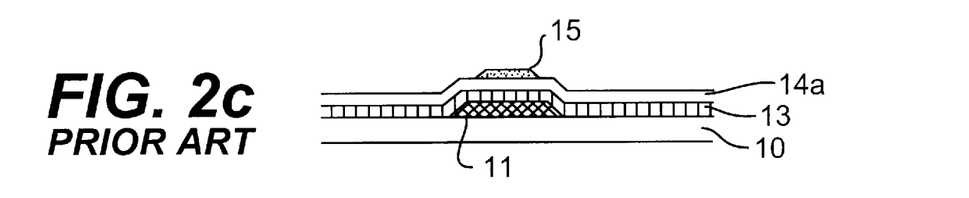

FIGS. 2a–2f illustrate various steps of the conventional process for fabricating a TFT with inverted stagger structure. As shown in FIG. 2a, metal is first deposited on to a transparent glass substrate 10 and etched to form a gate electrode 11. Over the substrate 10 and gate electrode 11, as shown in FIG. 2b, gate insulating layer 13, amorphous silicon(a-Si) layer 14a, and insulating layer 15a are successively deposited. The insulating layer 15a is etched to form and ES layer 15, as shown in FIG. 2c.

Figures 2D, 2E:
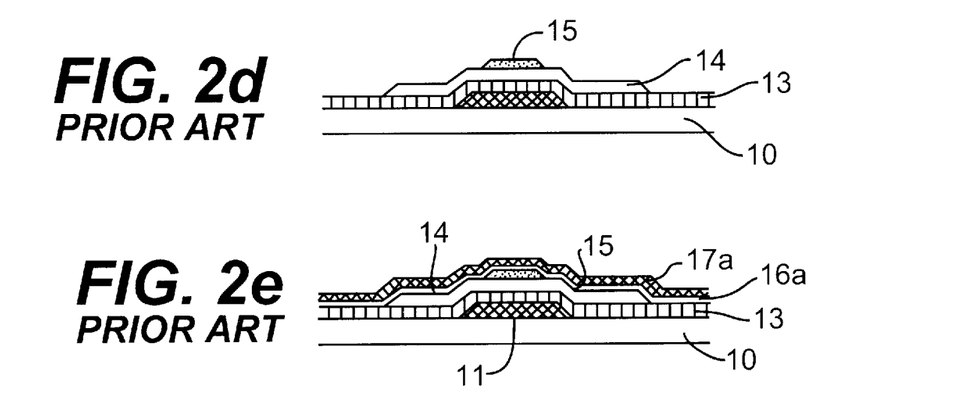
Figure 2F:
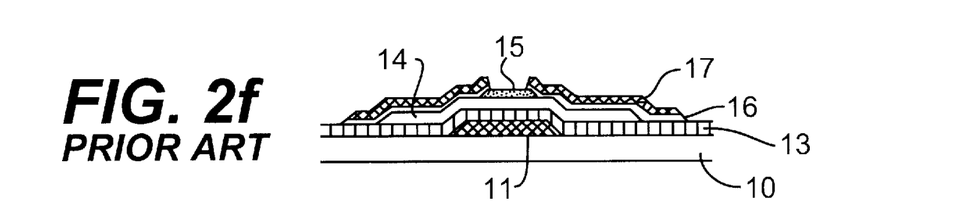

As shown in FIGS. 2d and 2e, $n^+$ a-Si layer 16a and metal layer 17a are deposited after a-Si layer 14a is etched to form a semiconductor layer 14. To form ohmic contact layer 16 and the source/drain electrodes 17, the $n^+$ a-Si layer 16 and metal layer 17a are etched. As a result, a portion of ES layer 15 overlaps $n^+$ layer 16 and another portion is exposed. On source/drain electrodes 17 and ES layer 15, the passivation layer(not shown) is deposited. A contact hole is formed in the passivation layer and the pixel electrode 9 covers pixel region to connect it to source/drain electrodes 17.

In this process, since ES layer 15 covers the channel region of semiconductor layer 14, the channel region is non affected during the etching of the a-Si 14a and the $n^+$ a-Si 16a layers. As shown in the figures, however, six masks are needed to fabricate the TFT of the LCD; that is, masks for forming the gate electrodes, ES layer, semiconductor layer, source/drain electrodes and $n^+$ layer, contact hole, and pixel electrode. The resulting process is complex and costly.

SUMMARY OF THE INVENTION

An object of the present invention is to provide a method for fabricating a thin film transistor of a liquid crystal display device, in which the semiconductor layer and $n^+$ layer can be etched on a substrate with a single process.

Another object of the present invention is to provide a method for fabricating a thin film transistor of the liquid crystal display device having single or double insulating layers.

In other to achieve this object, a method consistent with this invention includes the steps of a method for fabricating a thin film transistor comprising the steps of providing a substrate, forming a gate electrode on the substrate, depositing a gate insulating layer on the substrate and the gate electrode, forming a semiconductor layer on the gate insulating layer, forming a first insulating layer on a portion of the semiconductor layer, forming an impurity semiconductor layer on the first insulating layer and semiconductor, forming a metal layer on the impurity semiconductor layer, etching the metal layer, the impurity semiconductor layer, the first insulating layer, and the semiconductor layer with a single process so as to form an ohmic contact layer and source/drain electrodes, and forming at least one second insulating layer on the gate insulating layer and the source/drain electrodes.

In addition, a device consistent with the present invention includes a thin film transistor formed by the method of providing a substrate, forming a gate electrode on the substrate, depositing a gate insulating layer on the substrate and the gate electrode, forming a semiconductor layer on the gate insulating layer, forming a first insulating layer on a portion of the semiconductor layer, forming an impurity semiconductor layer on the first insulating layer and the semiconductor, forming a metal layer on the impurity semiconductor layer, etching the metal layer, the impurity semiconductor layer, the first insulating layer, and the semiconductor layer with a single process so as to form an ohmic contact layer and source/drain electrodes, and forming a least one second insulating layer on the gate insulating layer and the source/drain electrodes.

Other features and advantages of the invention will be set forth in the description which follows, and in part will be apparent from the description, or may be learned by practice of the invention. The objectives and other advantages of the invention will be realized and attained by the system and method particularly pointed out in the written description and claims hereof as well as the appended drawings.

Both the foregoing general description and the following detailed description are exemplary and explanatory only, and are intended to provide further explanation of the invention as claimed. The accompanying drawings provide a further understanding of the invention and are incorporated in and constitute a part of this specification. They illustrate embodiments of the invention, and together with the description serve to explain the principles of the invention.

DETAILED DESCRIPTION OF THE INVENTION

The process of fabricating the TFT of the LCD will be described below in reference to FIGS. 3a–3g. Wherever possible, the same reference numbers will be used throughout the drawings to refer to the same or like parts.

Figure 3A:
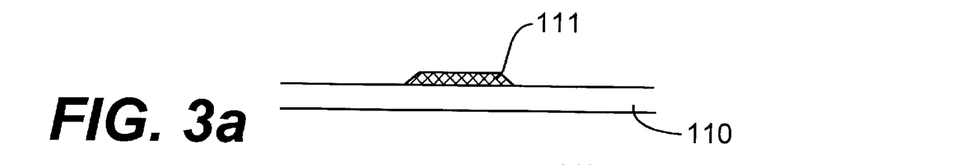
FIGS. 3a–3g are views illustrating the method of fabricating the thin film transistor of a liquid crystal display consistent with the present invention.
Figure 3B:
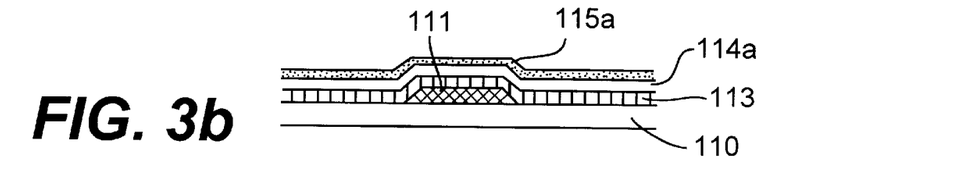

As shown in FIG. 3a, a metal, such as Mo, Cr, Al, or Al alloy, is deposited onto a transparent glass substrate 110 and then etched with a photoetching process to form a gate electrode 111. As shown in FIG. 3b, the gate insulation layer 113, a-Si layer 114a, and ES insulation layer 115a are formed on gate electrode 111 and substrate 110. In this forming, gate insulation layer 113(of SiOx or SiNx) and a-Si layer 114a are successively formed by plasma chemical vapor deposition(CVD).

Figure 3C:
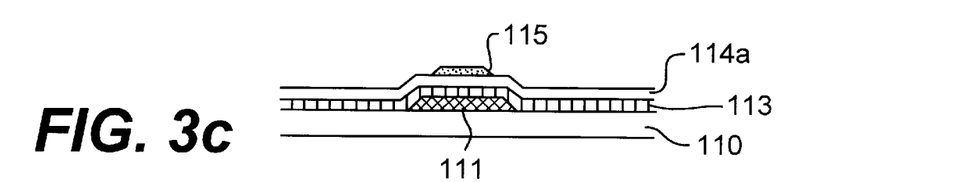
Figure 3D:
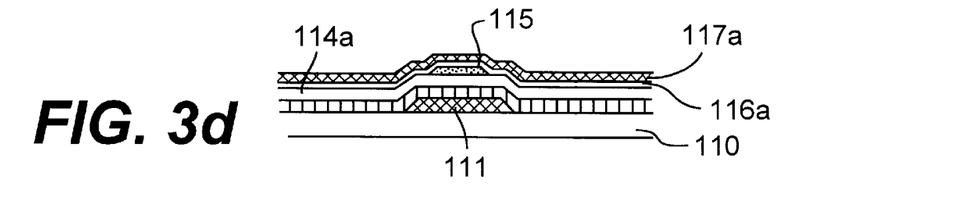

As shown in FIG. 3c, insulating layer 115a is etched to form an ES layer 115. As shown in FIG. 3d, semiconductor layer 114a is doped with $n^+$ ions or $n^+$ a-Si is directly deposited by plasma CVD to form an $n^+$ a-Si layer 116a. Metal comprising Cr, Mo, Al, or Al alloy is deposited thereon to form a metal layer 117a on ES layer 115 and a-Si layer 114a. When a-Si layer 114a is doped with $n^+$ ions, an $n^+$ a-Si layer 116a is formed only on a-Si layer 114a, not on ES layer 115. When $n^+$ a-Si is directly deposited, $n^+$ a-Si layer 116a is formed on a-Si layer 114a and ES layer 115.

Figure 3E:
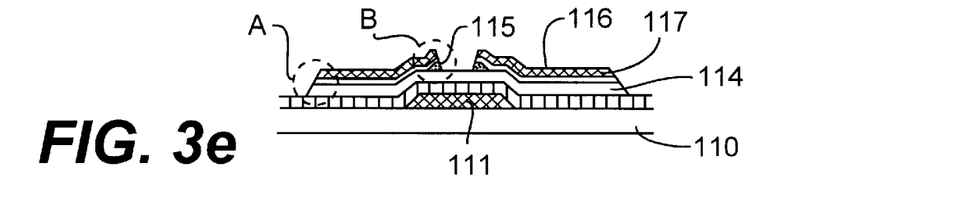
Figure 3F:
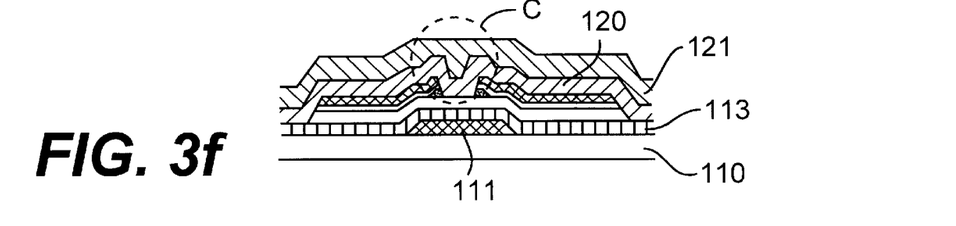
Figure 4:
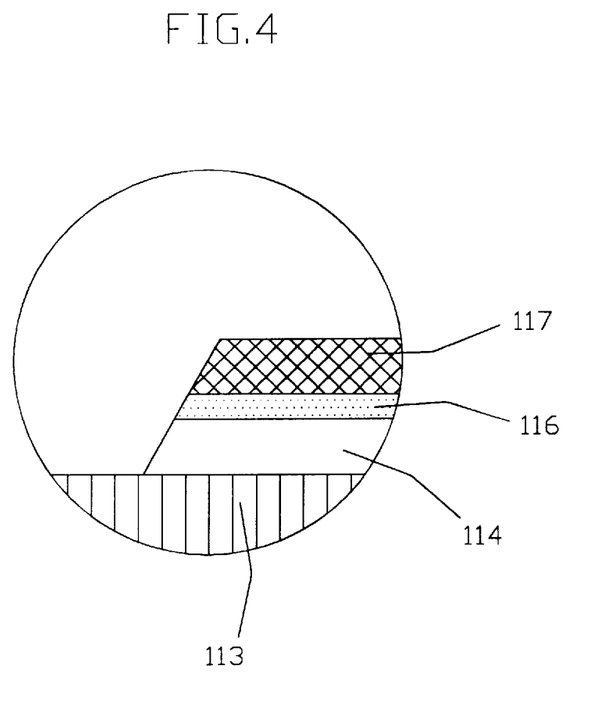
FIG. 4 is an enlarged view of part A of FIG. 3e.
Figure 5A:
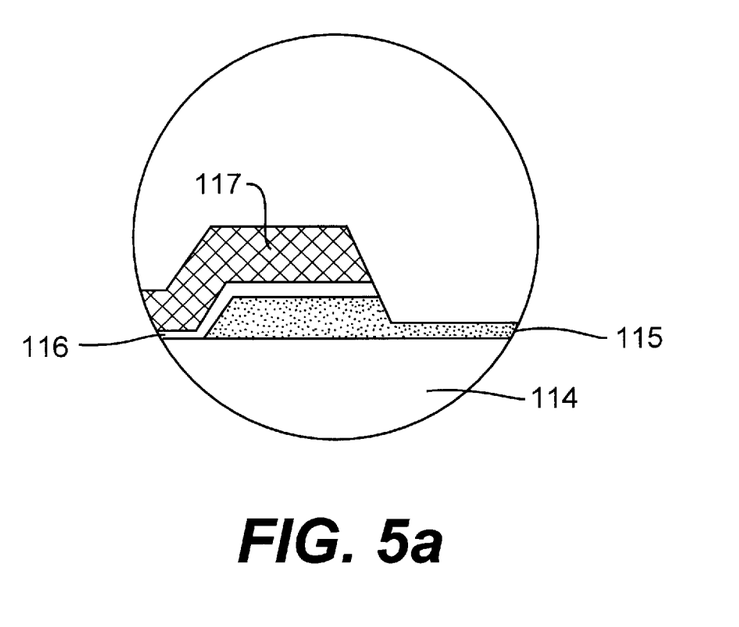
FIGS. 5a and 5b are enlarged views of part B of FIG. 3e.

Metal layer 117a, $n^+$ a-Si layer 116a, a-Si layer 114a and ES layer 115 are etched with a single process to form semiconductor layer 114, ohmic contact layer 116, and source/drain electrodes 117, as shown in FIG. 3e. That is, ES layer 115, $n^+$ a-Si layer 116a, and metal layer 117a are etched in part B, while a-Si layer 114a, $n^+$ a-Si layer 116a, and metal layer 117a are etched in part A, as shown in FIGS. 4 and 5a.

Figure 5B:
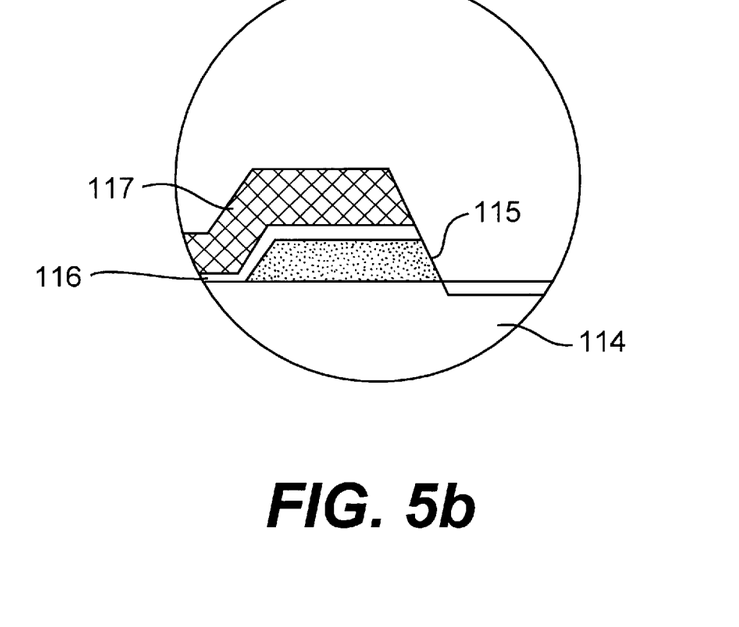

In the etching process, a-Si layer 114a of part A and ES layer 115 of part B are etched after the etching process of $n^+$ a-Si layer 116a and metal layer 117a of parts A and B. If a-Si layer 114a is thinner than ES layer 115, ES layer 115 is etched as much as a-Si layer 114a. As a result, a portion of ES layer 115 remains in the channel region, as shown in FIG. 5a. If the a-Si layer is thicker than ES layer 115, ES layer 115 is etched and then a portion of the a-Si layer 114a in the channel region is also etched, as shown in FIG. 5b.

In the case where the thickness of a-Si layer 114a is the same that of ES layer 115, if ES layer 115 has an etching selection ratio lower than that of a-Si layer 114a, a portion of ES layer 115 remains in the channel region because of the difference of the etching speed. Further, if the etching selection ratio of the ES layer 115 is higher than that of a-Si layer 114a, a portion of semiconductor layer 114a in the channel region is etched.

Figure 6A:
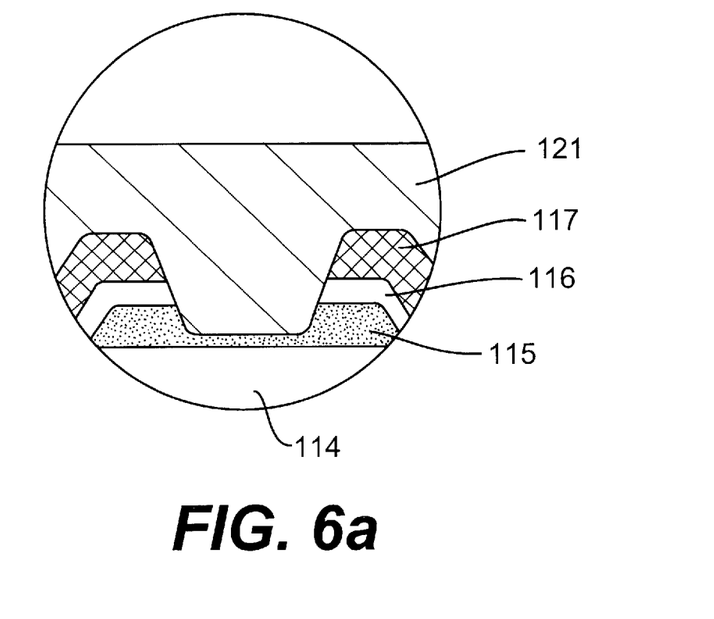
FIGS. 6a and 6b are enlarged views of part C of FIG. 3f.
Figure 6B:
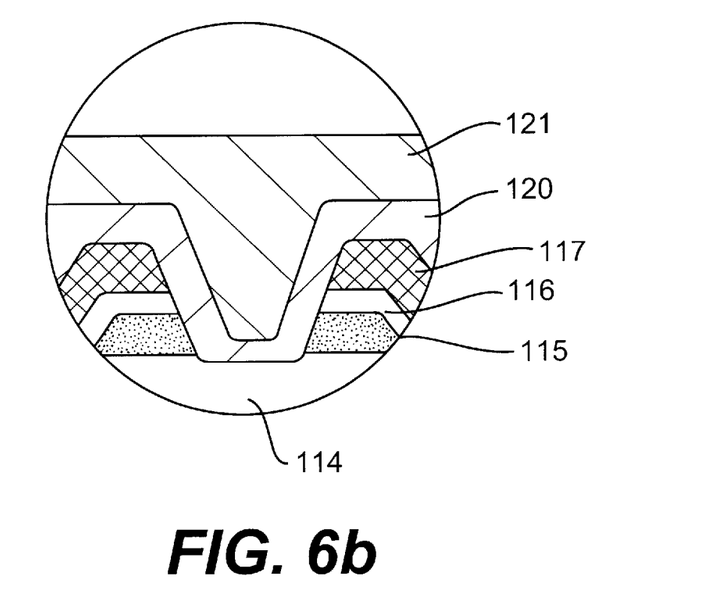

Thereafter, a single insulating layer or double insulating layers are formed on semiconductor layer 114 and source/drain electrodes 117. If a-Si layer 114a is thinner than ES layer 115 or if ES layer 115 has a lower etching selection ratio than a-Si layer 114a, ES layer 115 remains in the channel region of semiconductor layer 114. Thus, an organic layer 121 such as resin is used as an insulating layer, as shown in FIG. 6a. Further, if a-Si layer 114a is thicker than ES layer 115 or if ES layer 115 has a higher etching selection ratio than a-Si layer 114a, semiconductor layer 114 in the channel region is exposed. Therefore, inorganic insulating layer 120 including SiNx and SiOx is formed on semiconductor layer 114 and source/drain electrodes 117 and organic insulating layer 121 such as resin is next formed thereon, as shown in FIG. 6b. Although FIG. 6b shows a TFT comprising two insulating layers, inorganic insulating layer 120 and organic insulating layer 121, a TFT comprising only one insulating layer, for example, organic insulating layer 121, is possible as shown in FIG. 6a.

Figure 3G:
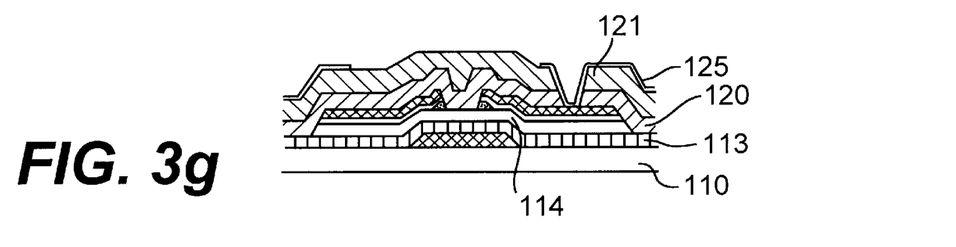

As shown in FIG. 3g, insulating layer 120 and 121 are patterned to form the contact hole over source/drain electrodes 117 and then a pixel electrode 125 is deposited on insulating layers 120 and 121 in the pixel region. One of the source/drain electrodes 117 and pixel electrodes 125 interconnected through the contact hole.

In the TFT fabricated by this process, semiconductor layer 114 is exposed or ES layer 115 remains thereon according to thickness difference or etching speed difference between semiconductor layer 114 and ES layer 115. According to the thickness of semiconductor layer 114 and the type of ES layer 115, thus, the TFT shape varies. Specifically, when semiconductor layer 114 is thinner than ES layer 115 or the etching selection ratio of ES layer 115 is lower than that of semiconductor layer 114, the TFT is an ES TFT. Further, when semiconductor layer 114 is thicker than ES layer 115 or the etching selection ratio of ES layer 115 is higher than that of semiconductor layer 114, the TFT is a BCE TFT.

In an ES TFT, since ES layer 115 covers the channel region of semiconductor layer 114, organic insulating layer 121 including resin is formed on source/drain electrodes 117 and semiconductor layer 114. In a BCE TFT, because semiconductor layer 114 in the channel region is exposed, inorganic insulating layer 120 including SiNx and SiOx is formed and inorganic insulating layer 121 such as resin as resin are also formed thereon.

In the present invention, since the semiconductor layer, the ohmic contact layer, the source/drain electrodes, and the ES layer are etched with single process, there is need to provide five masks as follows: a mask for forming the gate electrode; a mask for forming the ES layer; a mask for forming the semiconductor layer, the $n^+$ a-Si layer, and the source/drain electrodes; a mask for forming contact hole; and a mask for forming pixel electrodes. Therefore, the process is simpler than the conventional process. In addition, since the ES TFT or BCE TFT can be fabricated by controlling the thickness of the semiconductor layer or the etching-selection ratio of the ES layer, a TFT of the desired type can be fabricated.

While the preferred form of the present invention has been described, modifications will be apparent to those skilled in the art without departing from the spirit of the invention.

The scope of the invention, therefore, is to be determined solely by the following claims, and their equivalent.

What is claimed is:

1. A method for fabricating a thin film transistor comprising the steps of:

providing a substrate;

forming a gate electrode on the substrate; depositing a gate insulating layer on the substrate and the gate electrode;

forming a semiconductor layer on the gate insulating layer;

forming a first insulating layer on a portion of the semiconductor layer;

forming an impurity containing semiconductor layer on the first insulating layer and the semiconductor layer;

forming a metal layer on the impurity containing semiconductor layer;

etching the metal layer, the impurity containing semiconductor layer, the first insulating layer, and the semiconductor layer with a single process so as to form an ohmic contact layer and source/drain electrodes; and forming at least one second insulating layer on the gate insulating layer and the source/drain electrodes.

2. The method for fabricating a thin film transistor according to claim 1, wherein the gate insulating layer and the semiconductor layer are successively deposited.

3. The method for fabricating a thin film transistor according to claim 1, wherein the first insulating layer includes an etch stopper layer.

4. The method for fabricating a thin film transistor according to claim 1, wherein the first insulating layer is thinner than the semiconductor layer.

5. The method for fabricating a thin film transistor according to claim 4, wherein the step of forming the second insulating layer includes the steps of:

forming an inorganic insulating layer on the gate insulating layer and the source/drain electrode; and forming an organic insulating layer on the inorganic insulating layer.

6. The method for fabricating a thin film transistor according to claim 5, wherein the inorganic insulating layer includes SiNx and SiOx.

7. The method for fabricating a thin film transistor according to claim 5, wherein the organic insulating layer includes resin.

8. The method for fabricating a thin film transistor according to claim 1, wherein the first insulating layer is thicker than the semiconductor layer.

9. The method for fabricating a thin film transistor according to claim 8, wherein the step of forming the second insulating layer includes the step of:

forming an organic insulating layer on the gate insulating layer and the source/drain electrodes.

10. The method for fabricating a thin film transistor according to claim 9, wherein the organic layer includes resin.

11. The method for fabricating a thin film transistor according to claim 1, wherein the etching selection ratio of the first insulating layer is higher than that of the semiconductor layer.

12. The method for fabricating a thin film transistor according to claim 1, wherein the step of forming the second insulating layer comprises the steps of:

forming an inorganic insulating layer on the gate insulating layer and the source/drain electrodes; and forming an organic insulating layer on the inorganic insulating layer.

13. The method for fabricating a thin film transistor according to claim 12, wherein the inorganic insulating layer includes SiNx and SiOx.

14. The method for fabricating a thin film transistor according to claim 12, wherein the organic layer includes resin.

15. The method for fabricating a thin film transistor according to claim 1, wherein the etching selection ratio of the first insulating layer is lower than that of the semiconductor layer.

16. The method for fabricating a thin film transistor according to claim 15, wherein the step of forming the second insulating layer includes the step of:

forming an organic insulating layer on the gate insulating layer and the source/drain electrodes.

17. The method for fabricating a thin film transistor according to claim 16, wherein the organic insulating layer includes resin.

* * * * *

UNITED STATES PATENT AND TRADEMARK OFFICE
CERTIFICATE OF CORRECTION

PATENT NO. : 5,874,326
DATED : February 23, 1999
INVENTOR(S) : Ki Hyun LYU

It is certified that error appears in the above-identified patent and that said Letters Patent is hereby corrected as shown below:

Claim 12, column 6, line 15, "claim 1" should read
--claim 11--.

Signed and Sealed this

Thirtieth Day of November, 1999

Attest:

Q. TODD DICKINSON

Attesting Officer

Acting Commissioner of Patents and Trademarks